United States Patent
Lim

[19]

[11] Patent Number: 6,043,681
[45] Date of Patent: Mar. 28, 2000

[54] CMOS I/O CIRCUIT WITH HIGH-VOLTAGE INPUT TOLERANCE

[75] Inventor: Peter J. Lim, San Jose, Calif.

[73] Assignee: Oak Technology, Inc., Sunnyvale, Calif.

[21] Appl. No.: 09/378,777

[22] Filed: Aug. 20, 1999

Related U.S. Application Data

[63] Continuation of application No. 08/868,523, Jun. 4, 1997, Pat. No. 5,990,705.

[51] Int. Cl.⁷ .............................................. H03K 19/0185
[52] U.S. Cl. ................................. 326/81; 326/83
[58] Field of Search ................................. 326/56–58, 80, 326/81, 83, 86

[56] References Cited

U.S. PATENT DOCUMENTS

| | | | |
|---|---|---|---|
| 5,396,128 | 3/1995 | Dunning et al. | 326/68 |
| 5,450,025 | 9/1995 | Shay | 326/81 |
| 5,543,733 | 8/1996 | Mattos et al. | 326/81 |
| 5,635,860 | 6/1997 | Westerwick | 326/81 |
| 5,729,157 | 3/1998 | Monk et al. | 326/80 |
| 5,736,869 | 4/1998 | Wei | 326/81 |
| 5,831,449 | 11/1998 | Shigehara et al. | 326/81 |

FOREIGN PATENT DOCUMENTS

WO 94/29961  12/1994  WIPO .......................... H03K 19/003

*Primary Examiner*—Michael Tokar
*Assistant Examiner*—Don Phu Le
*Attorney, Agent, or Firm*—Townsend and Townsend and Crew LLP

[57] ABSTRACT

The invention provides for an input/output circuit in a CMOS integrated circuit which can withstand pad voltages which are higher than the supply voltages for the integrated circuit. The input/output circuit has a pair of first polarity-type transistors which is connected in series between a first supply voltage terminal and the input/output pad, and a pair of second polarity-type transistors which is connected in series between a second supply voltage terminal and the pad. Responsive to a disable control signal, one of the first polarity-type and one of the second polarity-type transistors are turned off. Switch circuitry is connected between the pad and a gate of a second transistor of the second polarity-type transistor pair. The switch circuitry forms an open circuit when the pad voltage is in the range of the supply voltages of the input/output circuit, and forms a closed circuit to connect the gate to the pad when the pad voltage is outside the range of supply voltages so that no conducting path is created through the pair of second polarity-type transistors. This allows the pad to remain in a high impedance state even when the pad voltage is outside the range of supply voltages.

10 Claims, 3 Drawing Sheets

CMOS I/O CIRCUIT WITH HIGH-VOLTAGE INPUT TOLERANCE

This application is a continuation of Ser. No. 08/868,523, filed Jun. 4, 1997, now U.S. Pat. No. 5,990,705.

BACKGROUND OF THE INVENTION

The present invention relates generally to integrated circuit design and, more particularly, to the design of input/output circuits which can withstand voltages higher than the supply voltages for the integrated circuit.

Integrated circuits typically have input/output (I/O) circuits which act as an interface between the rest of the integrated circuit and the electrical environment external to the integrated circuit. The I/O circuit drives electrical signals generated by the integrated circuit to a pad which is connected to the external environment, or receives signals for the integrated circuit from the external environment through the pad.

A constant drive in integrated circuit technology is toward greater integration with more devices on an integrated circuit substrate. Each successive fabrication technology has demanded smaller geometries and thinner gate oxides in the case of MOS technologies. Due to device breakdown at higher voltages, as well as power considerations, lower power supplies have become increasingly commonplace for integrated circuits. For example, at 0.5 $\mu$m and 0.35 $\mu$m CMOS technologies, power supplies are typically +3.3V. However, a problem arises when the integrated circuit must interface with other integrated circuits and systems operating at the older power supply standard, +5.0V, for example.

FIG. 1 graphically illustrates the problem. In this case, two integrated circuits 10 and 11 both share a bus line 12. The integrated circuit 10, which operates with a +3.3V power supply, i.e., between 0 and +3.3 volts, has an I/O driver circuit 14 which is connected to a pad 13 and to an input node 16. In response to logic signals from the rest of the integrated circuit 10, the circuit 14 drives the logic signals onto the pad 13 in a voltage range between 0 and +3.3 volts. The pad 13 is connected to the bus line 12 which, in turn, is connected to a similar pad (not shown) on the integrated circuit 11. The integrated circuit 11, which operates at a +5.0V power supply, i.e., between 0 and +5.0 volts, drives the bus line 12 in a voltage range between 0 and +5.0 volts through an I/O driver circuit 15 in response to logic signals on an input node 17 to the circuit 15. Of course, while the I/O circuit 15 is stated as part of the integrated circuit 11, the circuit 15 might be also a separate device which drives the bus 12. Nonetheless, the problems stated are basically the same.

When the I/O circuit 14 on the integrated circuit 10 is not in operation, the I/O circuit 14 is disabled by an OE (Output Enable) control signal, as shown in FIG. 1. At the same time, the I/O circuit 15 on the integrated circuit 11 is enabled (OE control signal ON, as shown in FIG. 1) to drive logic signals from the integrated circuit 11 onto the bus line 12. The pad 13 receives the logic signals from the I/O circuit 15. Without a proper design of the I/O circuit 14, high discharge currents may pass through the elements of the circuit 14 when the shared bus line 12 is driven to +5V, i.e., to a voltage greater than I/O circuit's operating voltage. This greater voltage may destroy or degrade the sensitive devices of the I/O circuit 14. Furthermore, the high currents drawn by the circuit 14 might also damage the I/O circuit 15.

Various designs have been proposed to address this problem. However, they all have one or more of the following shortcomings. Some proposed driver circuits may be able to tolerate +5V, but the output drive of the circuit is too low. Other shortcomings include allowing the N-type bulk regions (the N-well regions holding the PMOS transistors) of the integrated circuit to float with no control during some of the operating conditions. The output drive may be degraded by a badly controlled potential in the N-type bulk regions. Excessive current may flow when the P-diffusion-to-N-well diffusion is forward-biased. High voltages (+5V) may also be created across the thin gate oxide of the MOS transistors. In some designs the gates of the transistors are connected directly to the pad, which renders the MOS transistors susceptible to undesirable electrostatic discharge.

The present invention avoids, or substantially mitigates, these problems.

SUMMARY OF THE INVENTION

The invention provides for an input/output circuit in a CMOS integrated circuit. The input/output circuit operates between a first and a second supply voltage to drive logic signals between the first and second supply voltages onto a pad, which may be connected to a signal line carrying logic signals between the first supply voltage and a third supply voltage. The first and second supply voltages define a first voltage range and the first and third supply voltages define a second voltage range, with the second voltage range greater than the first voltage range.

The input/output circuit has a control node, an input node, a logic block, a pair of first polarity-type transistors, a pair of second polarity-type transistors, and switch circuitry. The control node receives an enable/disable control signal and the input node receives a logic signal from the remainder of the integrated circuit. The logic block is connected to the control node and the input node, and has first and second output nodes. The logic block generates set opposite logic signals on the output nodes responsive to a disable control signal on the control node. Responsive to an enable control signal on the control node, the logic block also generates logic signals on the output nodes corresponding to logic signals at the input node.

The pair of first polarity-type transistors is connected in series between a first supply voltage terminal and the pad, with one of the first polarity-type transistors having a gate connected to the first output node. The transistor turns off responsive to a set logic signal at the first output node responsive to the disable control signal at the control node. The pair of second polarity-type transistors is connected in series between a second supply voltage terminal and the pad, with one of the second polarity-type transistor having a gate connected to the second output node. Responsive to the disable control signal at the control node, that transistor turns off responsive to a set logic signal at the second output node.

The switch circuitry is connected between the pad and a gate of a second transistor of the second polarity-type transistor pair. The switch circuitry forms an open circuit when the pad voltage is in the first voltage range, and forms a closed circuit to connect the gate to the pad when voltage on the pad is in the second voltage range and not in the first voltage range so that no conducting path is created through the pair of second polarity-type transistors when voltage on the pad is in the second voltage range and not in the first voltage range. This allows the pad to remain in a high impedance state even when the pad voltage is outside the first voltage range.

DETAILED DESCRIPTION OF THE SPECIFIC EMBODIMENTS

Figure 1:
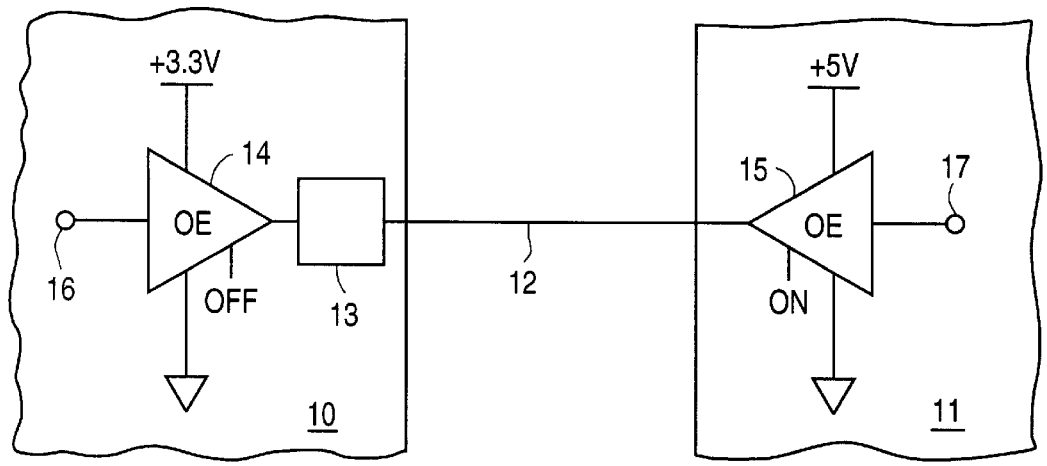
FIG. 1 is a block diagram of a general circuit environment for the input/output circuit of the present invention.
Figure 2:
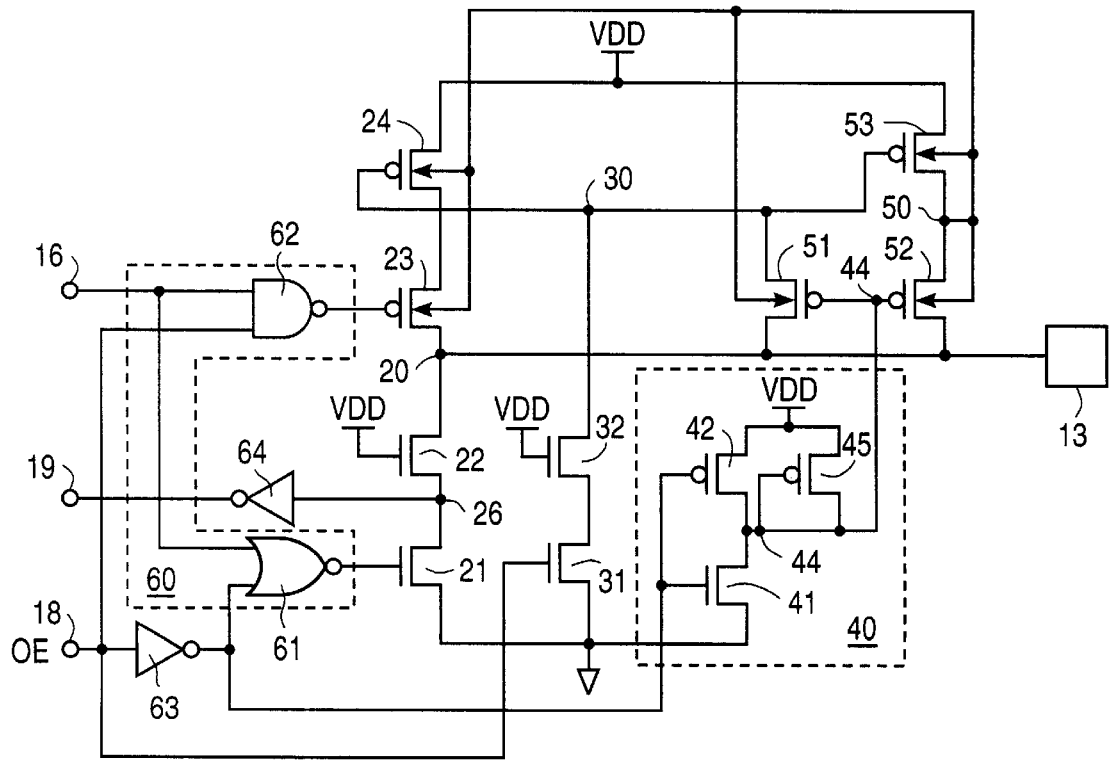
FIG. 2 is a detailed diagram of an input/output circuit according to one embodiment of the present invention.

FIG. 2 illustrates an I/O circuit according to one embodiment of the present invention. The I/O circuit is implemented in a CMOS integrated circuit with PMOS transistors, i.e., MOS transistors having P-type source/drain regions in N-type substrate, also termed bulk, regions, and NMOS transistors, i.e., MOS transistors having N-type source/drain regions in P-type substrate regions. Of course, it should be understood that a transistor symbol with a circle on the gate represents a PMOS transistor and a transistor symbol without a circle on the gate represents an NMOS transistor. The power supply voltage in this circuit is denoted as VDD, being equal to +3.3V. In passing, it should be noted that some of the reference numbers in FIG. 1 are also used in FIG. 2 to denote similar elements or elements with similar functions in the two drawings, for a better understanding of the present invention.

The I/O circuit has an input node 16, a control node 18, and a transfer node 19. The input node 16 receives logic signals from the rest of the integrated circuit to drive logic signals onto the pad 13 when the I/O circuit is enabled. The control node 18 receives a control signal to enable or disable the I/O circuit. When the I/O circuit is disabled, the transfer node 19 passes logic signals received at the pad 13 to the rest of the integrated circuit.

A node 20 is connected to the pad 13. A pair of pulldown NMOS transistors 21 and 22 are connected in series between the node 20 and the ground voltage supply. The gate of the NMOS transistor 22 has its gate connected to the positive voltage supply at VDD, +3.3 volts. The node 20 is also connected to the positive voltage supply at VDD by a pair of series-connected PMOS transistors 23 and 24. The gate of the PMOS transistor 24 is connected to a node 30, which is described further below. The gates of the NMOS transistor 21 and PROS transistor 23 are connected to an input logic block 60.

The input logic block 60 is formed by a NOR logic gate 61 and a NAND logic gate 62. The output terminal of the NOR gate 61 is connected to the gate of the NMOS transistor 21 and the output terminal of the NAND gate 62 is connected to the gate of the PMOS transistor 23. An input terminal of each logic gate 61 and 62 is connected to the control node 18. The input terminal of the NAND gate 62 is connected directly to the node 18 and the input terminal of the NOR gate 61 is connected through an inverter 63. A second input terminal of each logic block 61 and 62 is connected to the input node 16.

The input logic block 60 operates with the control signal on the control node 18 so that when the control signal is a Disable signal, logic low, the logic gates 61 and 62 generates opposite logic signals to turn off the transistors 21 and 23. That is, the NOR gate 61 generates a logic "0" on the gate of the NMOS transistor 21 and the NAND gate 62 generates a logic "1" on the gate of the PMOS transistor 23. On the other hand, when the control signal on the node 18 is an Enable signal, logic high, the logic gates 61 and 62 pass the logic signal on the input node 16 to the gates of the transistors 21 and 23. Thus, with an Enable control signal, the I/O circuit drives the logic signals at the input node 16 onto the pad 13 by the pulldown action of the NMOS transistor 21 and the pullup action of the PMOS transistor 23. With a Disable signal, the node 20 and pad 13 are disconnected from other circuit elements in the I/O circuit to place the pad 13 into a high impedance state.

The node 30 is also connected to the ground voltage supply through two series-connected NMOS transistors 31 and 32. The gate of the transistor 32 is connected to VDD voltage supply.

The node 20 (and pad 13) is connected to source/drains of two PMOS transistors 51 and 52. The other source/drain of the PMOS transistor 51 is connected to the node 30. The source/drain of the PMOS transistor 52 is connected to a node 50 and a source/drain of a third PMOS transistor 53, which has its other source/drain connected to the VDD supply voltage. The gate of the transistor 53 is also connected to the node 30. The node 50 is connected to the N-type substrate, or bulk, regions (also termed N-well regions depending upon the particular semiconductor process used to manufacture the CMOS integrated circuit) of the pullup PMOS transistors 23 and 24, and PMOS transistors 51, 52, and 53.

The gates of the PMOS transistors 51 and 52 are connected to an output node 44 of a voltage generation block 40, which is formed by an NMOS transistor 41, and PMOS transistors 42 and 43. The NMOS transistor 41 and PMOS transistor 42 are connected in series between the VDD voltage supply and ground; the output node 44 is the common node between the two transistors 41 and 42. The PMOS transistor 43 is connected in a diode configuration between the VDD voltage supply and the output node 44 between the transistors 41 and 42. The NMOS transistor 41 is a long channel device which in conjunction with PMOS transistors 42 and 43 create a signal at the output node 44, which is at VDD when the I/O circuit is enabled and VDD−Vth (one threshold voltage below the VDD supply voltage) when the I/O circuit is disabled.

The I/O driver circuit operates in two modes. As explained previously, when the signal at the control node 18 is high (Enable), the circuit drives the pad 13 between 0V and +3.3V depending on the logic signal at the input node 16. When the signal at the control node 18 is low (Disable), the I/O circuit maintains the pad 13 in a high-impedance state regardless of externally driven voltages between 0 and +5V.

When Enabled, the I/O circuit basically consists of series-connected NMOS transistors 21 and 22, which function as the pulldown devices, and series-connected PMOS transistors 23 and 24, which function as the pullup device. The NMOS transistor 31 is turned on by the Enable signal and the node 30 and the gate of the pullup transistor 24 is pulled low. The gate of the other PMOS pullup transistor 23 is driven by the output of the NAND logic gate 62, which inverts the signal at the input node 16. The gate of NMOS pulldown transistor 22 is always tied to the supply (+3.3V) and the gate of the other NMOS pulldown transistor 21 is driven by the NOR logic gate 61, which also inverts the signal at the input node 16. Note that the PMOS transistor 53 is turned on with the node 30 low to ensure that the common bulk, the N-well regions, connection to the PMOS transistors 23–24 and 51–53 is tied to the VDD supply (+3.3V) for operation of these transistors. The PMOS transistors 51 and 52 are turned off during this mode of operation.

When the I/O circuit is Disabled, the circuit can serve as an input circuit to receive logic signals on the pad 13 and to pass the signals to the remainder of the integrated circuit. An inverter 64 has an input terminal connected to the node 26 between the pulldown NMOS transistors 21 and 22. The output terminal of the inverter 64 is connected to the transfer node 19. The signal voltages received at the pad 13 are passed through the NMOS transistor 22 to the node 26. The inverter 64 buffers these signals so that the signals swing between 0 and +3.3 volts at the transfer node 19.

In the Disable mode, there are two basic concerns. One is that the node 20 and pad 13 remain in a high-impedance state over the entire range of voltages, 0 to 5V, applied to the pad 13, i.e., there are no leakage paths in the I/O circuit. The second concern is that no element in the I/O circuit is damaged due to high voltages across the gate oxide of any MOS transistor of the I/O circuit.

With respect to the high-impedance aspect of the I/O circuit, it should be noted that the node 44 goes to VDD–Vth (one threshold below the VDD supply voltage) in the Disable mode. The logic signal to the gate of the PMOS pullup transistor 23 is high and the logic signals to the gate of the NMOS pulldown transistor 21 is low. Both transistors are nominally Off. Nonetheless, a concern is that the gate voltage (VDD) for the PMOS transistor 23 may not be sufficient to turn off the transistor 23 when the voltage on the pad 13 exceeds VDD+Vth (one threshold voltage above the VDD supply voltage). This is alleviated by the series-connected PMOS transistor 24. When the pad voltage moves above VDD, the PMOS transistor 51 switches on to tie the pad 13 to the gate of the PMOS transistor 24. Regardless of the state of the PMOS transistor 23, the second PMOS pullup transistor 24 is always off and non-conducting. This ensures that there is no current flow from the pad 13 to the voltage supplies.

To ensure that the PMOS transistors 23–24 and 51–53 operate as stated above, voltages of the N-type bulk of these transistors (and the other transistors) should be controlled such that: 1) the transistors operate correctly, and 2) when the voltage on the pad 13 goes to +5V, forward-biased PN junctions connected to the pad 13 are avoided. Such PN junctions reduce the impedance of the pad 13, as well as possibly activating parasitic bipolar structures which may lead to higher current flow, or latchup. Either possibility is undesirable. The described I/O circuit properly controls the bulk N-well regions of the PMOS transistors as well as the bulk regions of the other transistors.

When the voltage on the pad 13 is lower than VDD, +3.3 volts, the PMOS transistors 51 and 52 are switched off. This allows the node 50 which is connected to the N-type bulk regions of the PMOS transistors 23–24 and 51–53 to float within well constrained voltage limits. The node 50 cannot float too low since this is limited by the action of the PN junctions in which the P-doped region is tied to VDD (e.g., the source region of the PMOS transistor 53. On the other hand, the node 50 cannot float too high since the PMOS transistor 53 (whose gate and source are at VDD) will then turn on and keep the node 50 at VDD.

Figure 3:
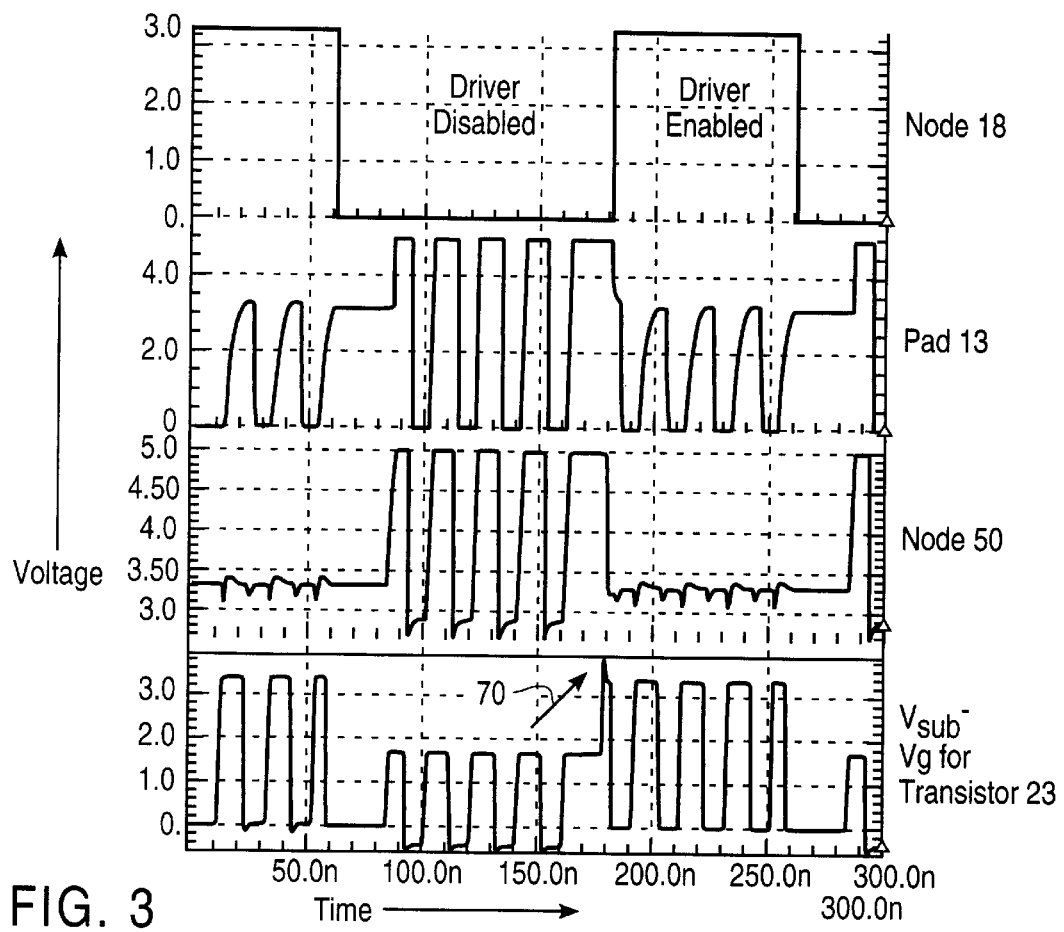
FIG. 3 is a plot of signals at various nodes of the FIG. 2 input/output circuit.

When the pad 13 is greater than VDD, the PMOS transistor 52 turns on to connect the node 50 to the pad 13. This ensures that all transistors operate as described above. FIG. 3 helps illustrate the operation of the I/O circuit by the plots of the voltages at various nodes, specifically, the control node 18, the pad 13 (node 20), node 50, and Vsub-Vg for PMOS transistor 23 (the difference between the voltages at node 50 and the gate).

With respect to the avoidance of high voltages across the gate oxides of any of the MOS transistors in the I/O circuit to prevent damage, it should be noted that the described I/O circuit has no transistors with gates which are connected directly to the pad 13. The NMOS transistors 22 and 32, which are cascade-connected, both limit the voltages at their sources (respectively, the node 26 and the common node between the transistors 31 and 32), as well as their gate-to-drain voltages. All other transistors which are connected to the pad 13 (i.e., the PMOS transistors 23, 51, and 52) have gates which are tied to the supply voltage VDD during the high-impedance state when high pad voltages occur. The PMOS transistor 53 and 24 have gate voltages which track the voltage on the pad 13 when the voltages on the pad 13 go very high, i.e., in excess of +3.3 volts. Hence voltages across the transistor gate oxides are minimized.

The worst case scenario occurs when the voltage on the pad 13 has been driven high and the node 50 connected to the N-type bulk regions is also high (+5V) as well, while the I/O circuit has been Disabled. When the I/O circuit is Enabled, the output from the NAND logic gate 62 may be immediately driven low (0V). The node 50 drops toward VDD (+3.3V) but may do so slowly. This may momentarily cause a large potential difference between the gate and bulk/drain of the PMOS pullup transistor 23. However, as shown by an arrow 70 in FIG. 3, this voltage is held to less than 4 volts with proper sizing of the transistors to avoid jeopardizing the integrity of the gate oxide of PMOS transistor 23.

Figure 4:
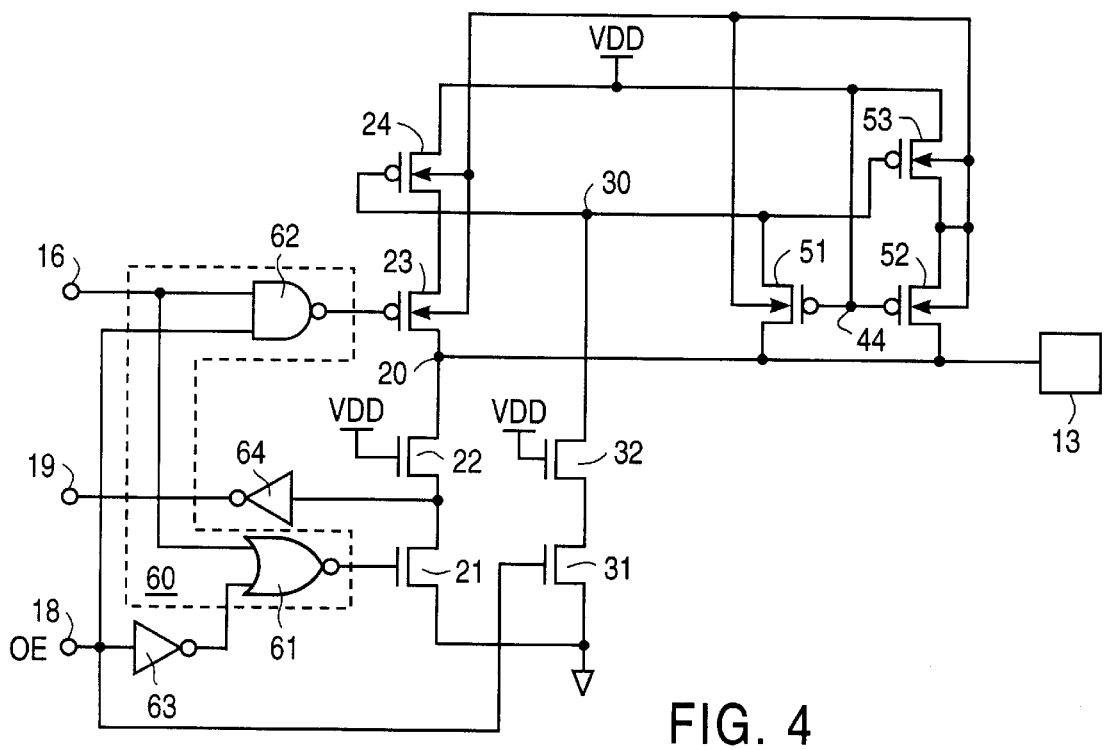
FIG. 4 is a circuit diagram of an alternative embodiment of the present invention.

FIG. 4 illustrates an alternate embodiment of the I/O circuit of the present invention. In this embodiment, the voltage generation block 40 is removed and the node 44 is connected to the voltage supply VDD. With the gates of the PMOS transistors 51 and 52 tied to VDD, the transistors 51 and 52 switch on somewhat later as the voltage on the pad 13 rises above VDD when the I/O circuit is Disabled.

Figure 5A:
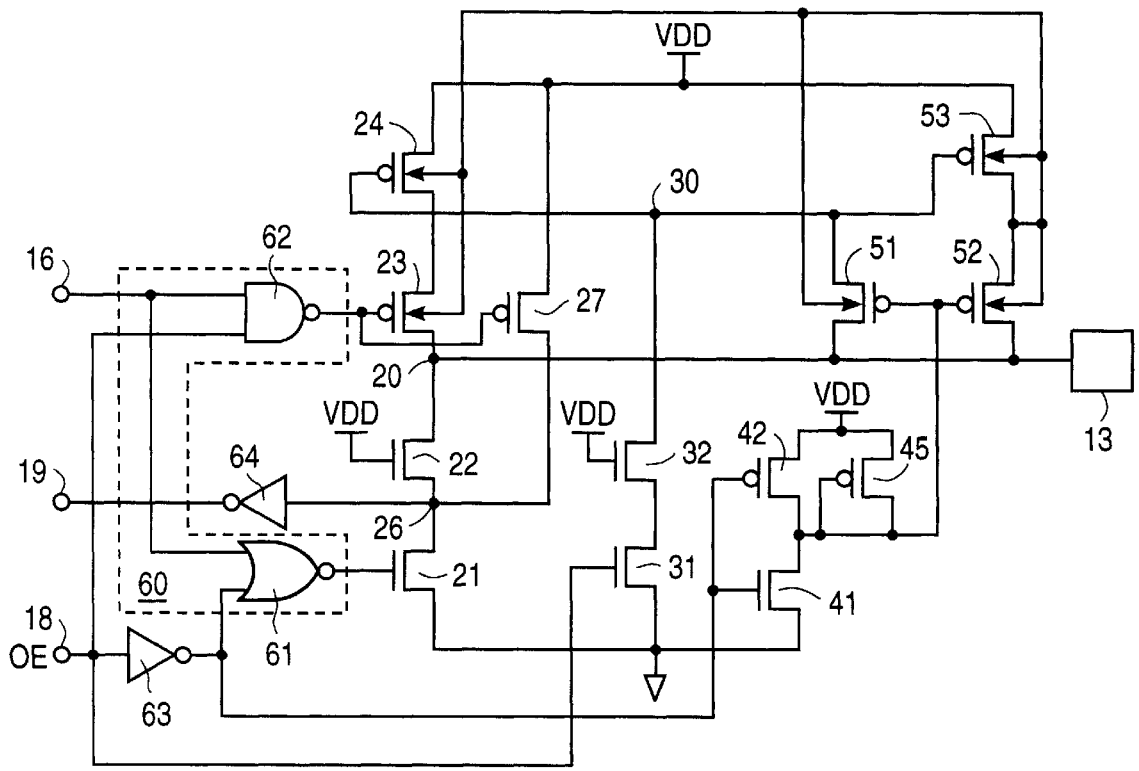
FIG. 5A is a circuit diagram of another alternative embodiment of the present invention.
Figure 5B:
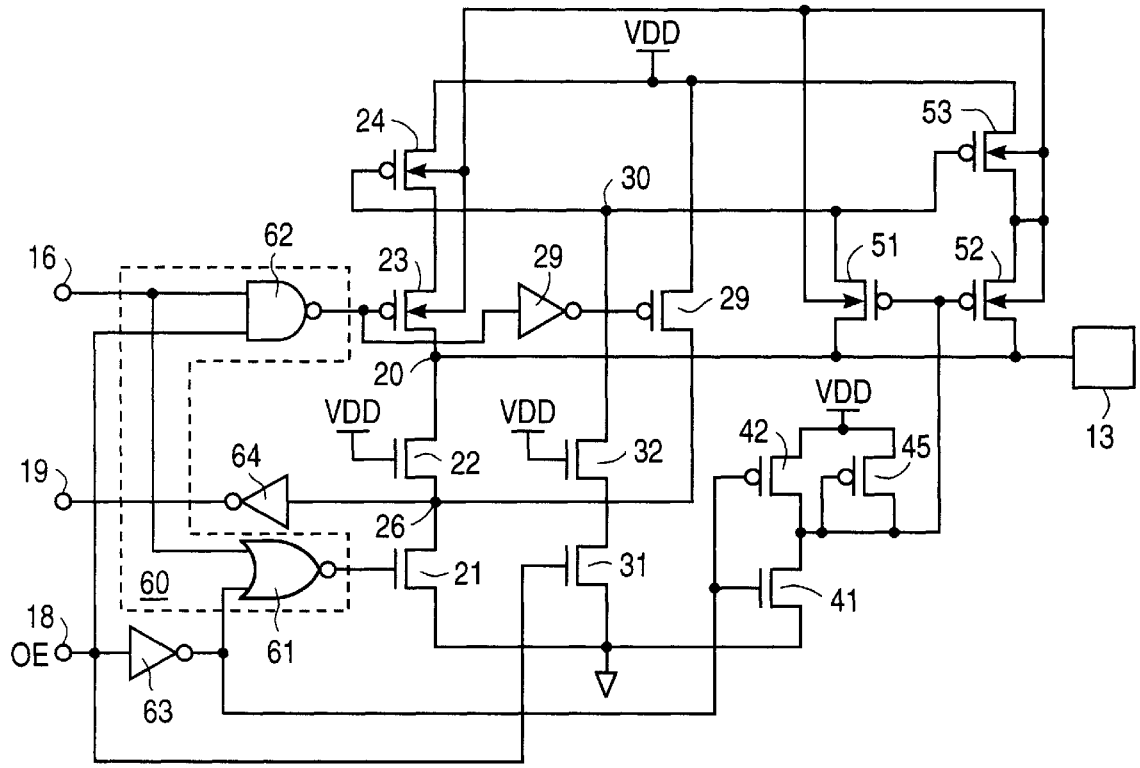
FIG. 5B is a circuit diagram of still another embodiment of the present invention.

FIGS. 5A and 5B illustrate variations of another embodiment of the present invention. In both variations transistors are added between the node 26 and the VDD voltage supply to improve the pullup operation when the I/O circuit is Enabled. In the FIG. 5A circuit, a PMOS transistor 27 is connected between the node 26 and the VDD voltage supply with the transistor gate connected to the output terminal of the NAND logic gate 62. In FIG. 5B an NMOS transistor 28 is used instead of a PMOS transistor. To ensure proper operation, an inverter 29 is added between the gate of the transistor 28 and the output terminal of the NAND logic gate 62.

While the foregoing is a complete description of the embodiments of the invention, various modifications, alternatives and equivalents may be used. For example, while the I/O circuit of the present invention was described in the context of positive voltage supplies and ground, the present invention is equally applicable to different voltages. For example, the description assumed the positive voltage supplies to be +3.3 Volts and +5.0 volts. Another emerging voltage supply standard for integrated circuits is 0 and +2.5 Volts. Hence the present invention is applicable to the situation in which the integrated circuits connected to a common bus operate between 0 and +2.5 volts, and between 0 and +3.3 volts. Furthermore, with appropriate changes to transistor polarities, the present invention can operate with negative voltage supplies. Accordingly, the above description should not be taken as limiting the scope of the invention which is defined by the metes and bounds of the appended claims.

What is claimed is:

1. In a CMOS integrated circuit, an input/output circuit operating between a first and a second supply voltage for driving logic signals between said first and second supply voltages onto a pad, said pad connectable to a signal line carrying logic signals between said first supply voltage and a third supply voltage, said first and second supply voltages defining a first voltage range, said first and third supply voltages defining a second voltage range, said second voltage range greater than said first voltage range, said input/output circuit comprising a control node receiving an enable/disable control signal;

an input node receiving a logic signal from a remainder of said integrated circuit;

a logic block connected to said control node and said input node and having a first and second output nodes, said logic block generating set opposite logic signals on said output nodes responsive to a disable control signal on said control node, said logic block responsive to an enable control signal on said control node generating logic signals on said output nodes corresponding to logic signals at said input node;

a pair of first polarity-type transistors connected in series between a first supply voltage terminal and said pad, one of said first polarity-type transistors having a gate connected to said first output node and turning off responsive to a set logic signal at said first output node responsive to said disable control signal at said control node;

a pair of second polarity-type transistors connected in series between a second supply voltage terminal and said pad, one of said second polarity-type transistor having a gate connected to said second output node and turning off responsive to a set logic signal at said second output node responsive to said disable control signal at said control node; and a first switch circuitry connected between said pad and a gate of a second transistor of said second polarity-type transistor pair, said first switch circuitry forming an open circuit when said pad voltage is in said first voltage range, and forming a closed circuit to connect said gate to said pad when voltage on said pad is in said second voltage range and not in said first voltage range so that no conducting path is created through said pair of second polarity-type transistors when voltage on said pad is in said second voltage range and not in said first voltage range;

a second switch circuitry connected between said pad and first polarity-type substrate regions in which said pair of second polarity transistors are located, said switch circuitry forming an open circuit when said pad voltage is in said first voltage range, and forming a closed circuit to connect said first polarity-type substrate regions to said pad when voltage on said pad is in said second voltage range and not in said first voltage range to ensure proper operation of said pair of second polarity-type transistors over said first and second voltage ranges whereby said pad remains in a high impedance state even said pad voltage is outside said first voltage range.

2. The input/output circuit of claim 1 wherein said second switch circuitry further comprises a second transistor of second polarity-type, said second transistor connected between said pad and said first polarity-type substrate regions, and having a gate connected to a voltage source at least within a threshold voltage of said second supply voltage.

3. The input/output circuit of claim 2 wherein said voltage source comprises a voltage generation circuit connected to said control node and having a third output node to said gate of said second polarity-type transistor, said voltage generation circuit generating said second supply voltage responsive to a enable signal on said control node and generating a threshold voltage from said second supply voltage responsive to a disable signal on said control node.

4. The input/output circuit of claim 2 wherein said voltage source comprises said second supply voltage.

5. The input/output circuit of claim 1 further comprising a third switch circuitry connected between said second supply voltage and said first polarity-type regions, said third switch circuitry forming an open circuit when control node has a disable signal and forming a closed circuit to connect first polarity-type regions to said second supply voltage when said control node has an enable signal to ensure proper operation of said pair of second polarity-type transistors when said input/output circuit is driving logic signals from said input node to said pad.

6. The input/output circuit of claim 5 wherein said third switch circuitry comprises a third transistor of second polarity-type, said third transistor connected between said second supply voltage and said first polarity-type regions, and having a gate connected to said first voltage supply when said control node has an enable signal.

7. The input/output circuit of claim 6 wherein said gate of said second transistor of said second polarity-type transistor pair is also connected to said first voltage supply when said control node has an enable signal.

8. The input/output circuit of claim 1 wherein said first switch circuitry comprises a second polarity-type transistor connected between said pad and a gate of said second transistor of said second polarity-type transistor pair, and having a gate connected to a voltage source at least within a threshold voltage of said second supply voltage.

9. The input/output circuit of claim 8 wherein said voltage source comprises a voltage generation circuit connected to said control node and having a third output node to said gate of said second polarity-type transistor, said voltage generation circuit generating said second supply voltage responsive to a enable signal on said control node and generating a threshold voltage from said second supply voltage responsive to a disable signal on said control node.

10. The input/output circuit of claim 8 wherein said voltage source comprises said second supply voltage.

* * * * *